United States Patent [19]

Michel et al.

[11] 3,715,635

[45] Feb. 6, 1973

[54] HIGH FREQUENCY MATCHED IMPEDANCE MICROCIRCUIT HOLDER

[75] Inventors: Donald E. Michel, Sidney; Richard R. Komatinsky, Upton, both of N.Y.

[73] Assignee: The Bendix Corporation

[22] Filed: June 25, 1971

[21] Appl. No.: 156,641

[52] U.S. Cl..........317/234 R, 317/234 F, 317/234 G, 333/34, 333/35, 174/52

[51] Int. Cl...............................H01l 3/00, H01l 5/00

[58] Field of Search.........317/234, 3, 3.1, 4, 4.1, 5.4; 174/52; 333/35, 34, 84 M; 206/59

[56] References Cited

UNITED STATES PATENTS

| | | | |
|---|---|---|---|
| 2,432,094 | 12/1947 | Fox | 333/35 |
| 2,576,186 | 11/1951 | Malter et al. | 333/35 |
| 3,008,089 | 11/1961 | Uhlir | 317/234 |
| 3,387,190 | 6/1968 | Winkler | 317/234 |
| 3,478,161 | 11/1969 | Carley | 317/234 |
| 3,489,956 | 1/1970 | Yanai et al. | 317/234 |
| 3,509,434 | 4/1970 | Yanai et al. | 317/234 |
| 3,546,543 | 12/1970 | Hessinger | 317/234 |
| 3,577,181 | 5/1971 | Belohoubek | 317/234 |
| 3,628,105 | 12/1971 | Sakai | 317/234 |

*Primary Examiner*—John W. Huckert
*Assistant Examiner*—Andrew J. James
*Attorney*—Raymond J. Eifler

[57] ABSTRACT

A high frequency (greater than $10^8$ hertz) microcircuit holder having a predetermined characteristic impedance that matches the impedance of the incoming transmission lines. The package is designed to achieve maximum power and/or signal transfer to a microcircuit hermetically sealed in the package. The characteristic impedance of the holder is reduced by a predetermined capacitance established between an input contact and a metal base plate. The impedance of the input contact is increased by reducing the cross-sectional area of the input contact as it passes through the dielectric wall of the microcircuit package. This increase in the impedance of the contact reduces the effect of the dielectric surrounding the contact which otherwise would result in a decrease in the impedance of the contact.

13 Claims, 4 Drawing Figures

INVENTORS.
RICHARD R. KOMATINSKY
& DONALD E. MICHEL
BY
R. J. Eifler
ATTORNEY

HIGH FREQUENCY MATCHED IMPEDANCE MICROCIRCUIT HOLDER

BACKGROUND OF THE INVENTION

This invention relates to the packaging of high frequency microcircuitry to obtain maximum power transfer to the microcircuit. The invention is more particularly related to controlling the impedance of a conductor carrying high frequency energy as it passes from one medium (air) to another (dielectric).

When transferring high frequency signals from one point to another by means of transmission lines consisting of metallic conductors, it is imperative to match the characteristic impedance of the line to the load being driven, otherwise most of the signal will be reflected from the mismatched section or dissipated in the transmission lines. All transmission lines or parallel conductor lines exhibit inductance (a function of conductor shape and cross-sectional area) and capacitance ( a function of the conductor shape, separation between conductors, and the dielectric constant of the medium between them). The surge or characteristic impedance of the conductors is the square root of the ratio of the per-unit-length inductance to the per-unit-length capacitance. An infinitely long transmission line when viewed from one end will exhibit its characteristic impedance. This impedance will be purely resistive and not contain either inductive or capacitive reactance. Such a line when employed in a short length (less than infinity) and terminated in a resistive load equal to its characteristic impedance will exhibit the identical resistive impedance at the line input end. A short line not terminated in its characteristic impedance (open or short circuited, or terminated in an impedance other than its characteristic impedance) will display an impedance at the line input end that is partially or entirely reactive and not equal to the characteristic impedance of the line. Under the conditions where a transmission line is not terminated in its characteristic impedance complete transfer of power from a source to a load does not occur. Failure to properly match the transmission system (termination, line, connectors, processing devices, etc.) results in standing waves on the transmission line. Voltage or current standing waves are the result of reflections due to discontinuities (mismatches) in the transmission system. Transmission systems which give rise to standing waves do not exhibit a frequency independent transmission efficiency, instead, cause the input impedance of the line to vary as a function of both frequency and line length. This course is most undesirable. Lossless matched systems, however, exhibit constant transmission efficiency and input impedance (resistive and equal to load impedance) as a function of frequency and line length.

Impedance matching of interconnections is imperative and becomes more critical as operating frequency increases and approaches microwaves (frequencies in excess of approximately $3 \times 10^8$ hertz). This is because physically short discontinuities become significantly large fractions of the operating wavelength. Low frequencies pose few problems because interconnect discontinuities are a negligible fraction of the operating wavelength.

Various methods exist for the packaging of microcircuitry. This microcircuitry may include thin film circuits, thick film circuits, discrete devices, and integrated circuits. These types of circuits normally require an enclosure for environmental isolation, physical protection, and interconnecting leads between the microcircuit in the enclosure and external circuitry. Numerous package designs utilize hermetically sealed glass walls between metal plates with leads passing through the glass wall to provide the necessary interconnection between the microcircuit and external circuitry. In high frequency microcircuitry packaging special attention is given to the impedance matching characteristics of input/output lines. One method widely employed utilizes machined or formed metal enclosures in which sidewall mounted coaxial connectors provide the transition and interconnection between the microcircuit in the enclosure and external circuitry. Bonding of jumpers between the microcircuit and the coaxial connector normally is used to complete the internal connection. Externally, coaxial cable or semirigid coaxial lines are used to connect the package to other circuitry. This method in some applications is imperative, particularly when a convenient disconnect is required; however, in numerous applications it is bulky and prohibitively expensive.

SUMMARY OF THE INVENTION

This invention provides a high frequency microcircuit enclosure that does not have the disadvantages of large size, weight, components and high cost.

The disclosed package combines the design and manufacturing techniques of metal-to-glass bonding, "-flatpack" packaging concepts and employs a lead design based upon asymmetrical strip transmission line (microstrip) theory. Asymmetrical or "Microstrip" transmission line is simply a flat strip (lead) separated by a dielectric from a wider strip (ground plane).

The resulting characteristic impedance of the microcircuit enclosure is a function of the input lead width, lead thickness, ground plane width, dielectric thickness and the magnitude of the dielectric constant. The usable frequency range and uniformity of impedance of the enclosure is a function of the tolerances maintained on component parameters and dimensions plus the variation in conductor and dielectric losses with frequency. For a further detailed discussion see A. Schwarzmann "Microstrip Plus Equations Adds Up to Fast Designs," Electronics, Oct. 2, 1967. Harold A. Wheeler "Transmission Properties of Parallel Strips Separated by a Dielectric Sheet," IEEE Transactions on Microwave Theory and Techniques, March 1965 Volume MTT-13/Number 2.

Each section of an input lead is design for proper impedance matching and compensation is provided in transition sections when required. The internally contained microcircuit when installed would be butt or lap bonded (soldered,welded, etc.) to microstrip lead ends. Leads not required to serve in a matched impedance function may be used for low frequency power and/or control functions or separate unmatched leads may be included in the package depending on user requirements. Modification of the flatpack packaging concept to include matched impedance input/output lines should fill the need for a more conpact, lower cost method of packaging VHF, UHF and microwave microcircuits.

The invention is a microcircuit holder characterized by an input contact that has a decreased cross-sectional area for that portion of the contact that passes through the wall of the circuit holder. In one embodiment of the invention, the microwave circuit holder comprises: a housing for receiving a high frequency microcircuit, the housing having a metal base plate, four walls of dielectric material forming a housing cavity; and an electrical contact mounted in the dielectric walls above said base plate, the contact having a first width W1 outside of the dielectric wall, a second width W2 embedded in the dielectric wall and a ratio of W1/W2 greater than 1.

Accordingly, it is an object of this invention to provide a high frequency microcircuit package having a predetermined characteristic impedance.

It is another object of this invention to reduce the effect of a dielectric material on the impedance of a conductor as the conductor passes through the dielectric material.

It is a further object of this invention to provide maximum power and/or signal transfer to a microcircuit enclosed in a hermetically sealed package.

It is still another object of this invention to reduce the size of the package that holds a microcircuit.

It is a still further object of this invention to provide a high frequency circuit contact that compensates for a change in impedance as the contact passes through the wall of a microcircuit enclosure.

The above and other objects and features of the invention will become apparent from the following detailed description taken in conjunction with the accompanying drawings and claims which form a part of this specification.

DETAILED DESCRIPTION OF THE DRAWINGS

Figure 1:
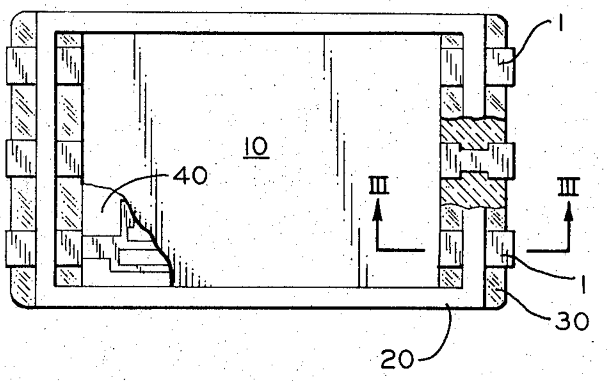
FIG. 1 is a top view of a microcircuit holder that embodies the principles of the invention.

Referring now to the drawings, FIG. 1 illustrates a microcircuit holder which comprises: a metal base plate 10; a metal gasket 20; a dielectric material 30 forming the walls of the holder; and a plurality of electrical contacts 1 that are embedded in and pass through the dielectric wall 30 of the holder. A microcircuit 40 fits into the cavity formed by the walls 30. The arrangement is such that if a potential was applied between the base plate 10 and the electrical contact 1 and/or between the electrical contact 1 and the metal gasket 20, there would be a capacitive effect between the metal contact and the metal surfaces. The outer portion of the lead 1 may be flush with the dielectric 30 for butt bonding to incoming conductors or the lead 1 may be extended slightly (as shown) for lap bonding to an incoming conductor. A portion of a microcircuit 40 is shown to illustrate how it is placed in the holder cavity.

Figure 2:
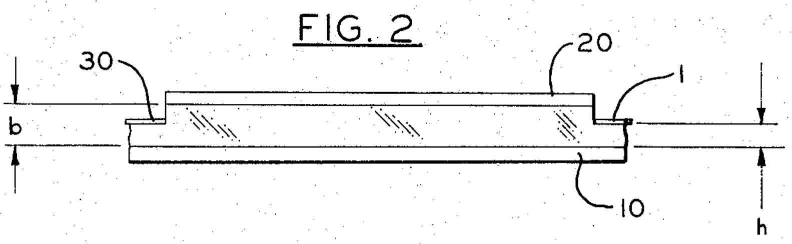
FIG. 2 is a side view of the microcircuit holder shown in FIG. 1.

FIG. 2 is a side view of the microcircuit holder shown in FIG. 1. This Figure illustrates how the dielectric walls 30 separate the metal base plate 10, electrical contact 1, and metal gasket 20 from each other. The electrical contact 1 is mounted in and passes through the dielectric wall 30 and is spaced from the surface of the metal base plate 10 by a predetermined distance H. The metal gasket 20 is spaced from the metal base plate by a predetermined distance B which is preferably equal to or greater than 2 $h$.

Figure 3:
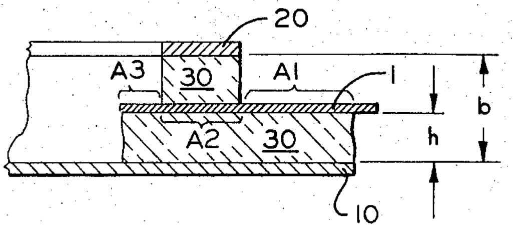
FIG. 3 is a cross-sectional view of the microcircuit holder taken along lines III—III of FIG. 1.

FIG. 3 is a cross-sectional view of the microcircuit holder that illustrates the structural arrangement of the components of the holder. The dielectric material 30 forms a wall of the microcircuit holder. This cross-sectional view illustrates how the electrical contact 1 is mounted in the dielectric material 30 to extend into the cavity formed by the dielectric material. A portion of the electrical contact 1 extending into the cavity is adapted to be connected to the microcircuit that is placed in the cavity and the portion of the electrical contact 1 that extends beyond the holder is adapted to receive incoming electrical signals and/or power. A1, A2, and A3 are those portions of the electrical contact 1 that will interact with metal base plate 10 in a capacitive manner when a potential is applied therebetween. A1 is only that portion of the electrical contact that is directly above the metal base plate 10. That portion of the electrical contact (A1) that extends beyond the edge of the dielectric material 30, outside the holder and not above the metal base plate 10 will be disregarded as having little or no effect on the capacitance of the holder.

Figure 4:
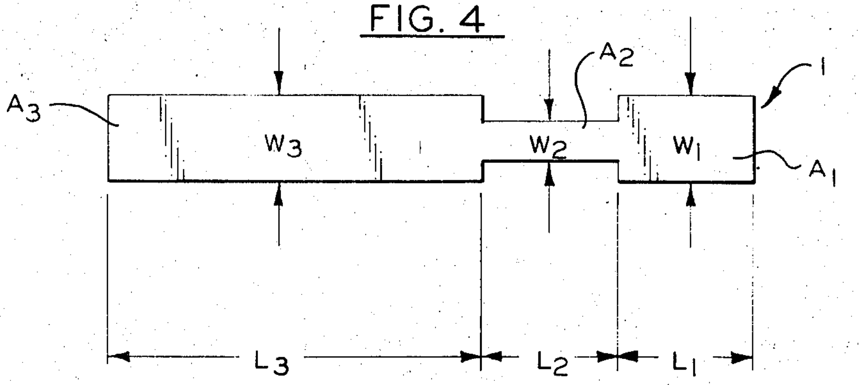
FIG. 4 is an enlarged view of the preferred configuration of a circuit contact that accomplishes the objects of this invention.

FIG. 4 is an enlarged view of the preferred configuration of a circuit contact that accomplishes the objects of this invention. The electrical contact 1 has three important sections (A1, A2, A3). The section, A3, that extends in the cavity, the section A2 that is surrounded by dielectric material and section A1 that extends outside of the holder. As is apparent from the drawings, the cross-sectional area and the surface of section A2 is reduced. Each section A1, A2 and A3 has a corresponding width W1, W2, W3 and corresponding length L1, L2, L3.

Technical Discussion

The inventor believes that the operation of his invention is based on the following technical principles.

To establish a predetermined characteristic impedance for a microcircuit holder, a predetermined capacitance is built into the holder. The capacitance is established between a metal base plate, preferably Kovar, (an expansion alloy especially suited for hermetically bonding to glass) and an electrical contact which is also preferably Kovar. From the following equations it is apparent that as a conductor in air passes into a different medium, such as a dielectric material, the impedance of the conductor is affected. To cancel the effect of the dielectric material on the impedance of the conductor, the inventor has varied the configuration of the conductor so that, in effect, he can neutralize the effect of the dielectric material and in fact can establish a given impedance for the electrical input contacts 1 of the microcircuit holder. The inventor offers the following equations to support and clarify the operation of his matched impedance microcircuit holder.

$\eta$ = Free Space Intrinsic Impedance$=120\pi\cong377$ ohms
$Z_o$ = Characteristic Impedance in Ohms
$V_p$ = Propagation Velocity in Meters/Sec.
$C$ = Capacitance in Farads Between Conductors
$\epsilon_r$ = Substrate Relative Dielectric Constant
$\epsilon_{eff}$ = Effective Relative Dielectric Constant
$\pi$ = Pi = 3.1416
$h$ = Lead Height Above Base
$W$ = Actual Lead Width
$\Delta W$ = Effective Increase in Lead Width due to Finite $t$
$W_{eff}$ = Total Effective Lead Width Due to Finite $t$
$t$ = Conductor (lead) Thickness
$\ln$ = Natural Logarithm
log = Common Logarithm
$b$ = Distance Between Base and Metal Gasket Characteristic Impedance of a transmission line may be expressed in general form as:

$Z_o = 1/V_pC$ (ohms)

Which may be expressed for $W$ less than $h$ as:

$Z_o = 60\,\epsilon_{eff}^{-1/2}\ln(8h/W_{eff})$ and which may be expressed for $h$ less than $W$ as:

$$Z_0\ \frac{240\pi\epsilon_{eff}^{-1/2}}{\frac{2W_{eff}}{h}+5-\frac{h}{W_{eff}}}$$

For a conductor where $h/4\pi$ is greater than lead thickness ($t$) and less than $W/2$ $W_{eff}$ may be expressed as follows:

$W_{eff} = W + \Delta W$ where $$\Delta W=\frac{t}{\pi}\left(\ln\frac{2h}{t}+1\right)$$

From the foregoing equations it can be determined that the impedance (Z) of a flat conductor of uniform thickness can be raised by changing the width (W) of the conductor. Further, at high frequencies, the impedance of the conductor will also be affected by the material surrounding the conductors. Deducing this information, the inventor experimented with his theories in the laboratory and arrived at the following conclusions: For a microcircuit holder having glass walls, a Kovar base plate, and flat Kovar leads, the ratio W1/W2 of the width (W1) of the lead outside the dielectric wall to the width (W1) of the lead inside the wall is less than 2 but greater than 1. This ratio operates to keep the characteristic impedance of the circuit holder in the area of 40 to 60 ohms which is desirable as the standard impedance of transmission lines at $10^9$ to $10^{10}$ hertz is about 50 ohms. Obviously, empirical work is required to supplement and improve upon any analytical design effort.

The foregoing equations alone do not guarantee a correct determination of the parameters that result in impedance matching of the microcircuit package to the transmission lines. Attention must be given to the following considerations when designing the characteristic impedance of a microcircuit enclosure.

1. The impedance of a conductor changes as it passes from one medium (air) to another.

2. Unknown capacitive effects on a high frequency circuit may be virtually eliminated by building into the circuit a known capacitance.

3. A strip conductor passing through a dielectric material (e.g., glass) exhibits a decrease in the characteristic impedance of such a conductor.

4. The characteristic impedance of a strip conductor passing through a dielectric material can be increased by decreasing the width of the conductor. There-fore, knowing the parameters that increase and decrease the impedance, the parameters can be adjusted so that the effective change in impedance as the conductor passes into a microcircuit holder is essentially zero.

5. For a strip of conducting material wherein $h/t$ is greater than 1,000, the thickness of the lead may be ignored as it is negligible.

6. A metal cover must be placed on the holder at a distance equal to or greater than $2h$ otherwise the foregoing equations and considerations do not adequately describe the invention.

7. The addition of a metal base plate and/or a metal cover increases the capacitance and decreases the impedance of the microcircuit package.

8. The electric field associated with that portion of the lead embedded in the dielectric material cannot be represented by symmetrical field equations as the electric field is not evenly distributed in such short distances and in view of the close proximity of the end of the wider portions of the lead.

9. In most applications, the enclosure is to be hermetically sealed and therefore materials such as glass and metals are preferred.

While a preferred embodiment of the invention has been shown, it will be apparent to those skilled in the art that changes may be made to the invention as set forth in the appended claims, and, in some cases, certain features of the invention may be used to advantage without corresponding use of other features. For example, the configuration of any of the components of the preferred embodiments may take various forms (round, square, etc.) and the material used, e.g., Kovar and glass may be replaced by other materials while the objects may still be achieved. Therefore, depending on the shape of the contacts, the ratios may be expressed in terms of area and/or width. Accordingly, it is intended that the illustrative and descriptive materials herein be used to illustrate the principles of the invention and not to limit the scope thereof.

Having described the invention, what is claimed is:

1. In combination with a microcircuit holder of the type having a metal base plate, dielectric walls forming a cavity to receive said microcircuit, and at least one electrical lead mounted in and passing through a dielectric wall, the improvement wherein said lead comprises:

a strip of electrically conducting material of substantially uniform thickness, generally parallel to and spaced from said base plate, said strip having a first width W1 outside said dielectric wall, a second width W2 in said wall and a ratio of W1/W2 greater than 1.

2. The combination as recited in claim 1 including a metal cover disposed on said dielectric walls and generally parallel to and spaced from said metal base plate a distance equal to or greater than $2h$ where $h$ is the distance between the metal base plate and said strip of conducting material located in said dielectric wall.

3. The combination recited in claim 2 wherein the ratio W1/W2 is greater than 1 but less than 2.

4. A microwave circuit holder comprising:

a housing comprising:

a metal base plate;

four walls defining a cavity of said housing, and at least one wall comprised of a dielectric material; and an electrical conductor mounted in said dielectric wall about said metal base plate, said conductor having a first portion of cross-sectional area A1 outside of said housing and a second portion of cross-sectional area A2 disposed in said dielectric wall, a third portion of cross-sectional area A3 inside said housing cavity and a cross-sectional area ratio of A1/A2 greater than 1.

5. The microwave circuit holder as recited in claim 4 wherein the ratio A3/A2 is greater than 1.

6. The microwave circuit holder as recited in claim 4 including a microwave circuit disposed in said housing cavity and in electrical circuit relationship with said electrical conductor; and means for hermetically sealing said microwave circuit in said housing.

7. The microwave holder as recited in claim 5 including a microwave circuit disposed in said housing cavity and in electrical circuit relationship with said electrical conductor; and means for hermetically sealing said microwave circuit in said housing.

8. The microwave circuit holder as recited in claim 4 wherein said dielectric material is glass and said base plate, said electrical conductor, and said metal strip are comprised of Kovar.

9. The microwave circuit holder as recited in claim 5 wherein said dielectric material is glass and said base plate, said electrical conductor, and said metal strip are comprised of Kovar.

10. The microwave circuit holder as recited in claim 6 wherein said dielectric material is glass and said base plate, said electrical conductor, and said metal strip are comprised of Kovar.

11. The microwave circuit holder as recited in claim 7 wherein said dielectric material is glass and said base plate, said electrical conductor, and said metal strip are comprised of Kovar.

12. In the combination of a microwave circuit package of the type including an enclosure, a microcircuit disposed in said enclosure, and a plurality of electrical lead wires extending from the enclosure and electrically communicating with said microwave circuit, the improvement wherein at least one of said electrical lead wires has a first portion of cross-sectional area A1 extending from the enclosure, a second portion of cross-sectional area A2 passing through a portion of said enclosure, a third portion of cross-sectional area A3 electrically connected to said microwave circuit inside said enclosure and a ratio of A1/A2 greater than 1.

13. A microwave circuit holder comprising:

a housing having a microwave circuit therein, said housing having at least one wall comprised of a dielectric material and an electrical conductor disposed in and passing through said dielectric material, said electrical conductor including means for compensating for the change in impedance of that portion of the conductor passing through the dielectric material so that the impedance of that portion of the electrical conductor outside the housing is the same as the impedance of that portion of the electrical conductor passing through said dielectric material, said means for compensating for the change in impedance of the conductor passing through the dielectric wall comprises a reduced cross-sectional area of that portion of the conductor passing through the dielectric material.

* * * * *